United States Patent
Weingarten et al.

(10) Patent No.: US 9,851,921 B1
(45) Date of Patent: Dec. 26, 2017

(54) FLASH MEMORY CHIP PROCESSING

(71) Applicant: AVAGO TECHNOLOGIES GENERAL IP (SINGAPORE) PTE. LTD., Yishun (SG)

(72) Inventors: Hanan Weingarten, Herzelia (IL); Erez Sabbag, Koranit (IL)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 134 days.

(21) Appl. No.: 14/919,558

(22) Filed: Oct. 21, 2015

Related U.S. Application Data

(60) Provisional application No. 62/188,672, filed on Jul. 5, 2015.

(51) Int. Cl.
    *G06F 3/06* (2006.01)

(52) U.S. Cl.
    CPC .......... *G06F 3/0653* (2013.01); *G06F 3/0604* (2013.01); *G06F 3/0614* (2013.01); *G06F 3/0616* (2013.01); *G06F 3/0679* (2013.01)

(58) Field of Classification Search
    CPC ............ G11C 16/0483; G11C 11/5642; G11C 11/5628; G11C 2211/5641; G11C 16/3418; G11C 2211/5645; G06F 11/00
    See application file for complete search history.

(56) References Cited

U.S. PATENT DOCUMENTS

| | | | |
|---|---|---|---|
| 4,430,701 A | 2/1984 | Christian et al. | |
| 4,463,375 A | 7/1984 | Macovski | |
| 4,584,686 A | 4/1986 | Fritze | |
| 4,589,084 A | 5/1986 | Fling et al. | |
| 4,777,589 A | 10/1988 | Boettner et al. | |
| 4,866,716 A | 9/1989 | Weng | |
| 5,003,597 A | 3/1991 | Merkle | |

(Continued)

FOREIGN PATENT DOCUMENTS

WO   WO2009053963 A2   4/2009

OTHER PUBLICATIONS

Search Report of PCT Patent Application WO 2009/118720 A3, dated Mar. 4, 2010.

(Continued)

*Primary Examiner* — Hashem Farrokh
(74) *Attorney, Agent, or Firm* — Sheridan Ross P.C.

(57) ABSTRACT

According to an embodiment of the invention there may be provided a non-transitory computer readable medium that stores instructions that once executed by a computer cause the computer to sample a flash memory cell that belongs to a die, by attempting, during a gate voltage change period, to change a value of a gate voltage of the flash memory cell from a first value to a second value; sampling, by a sampling circuit that belongs to the die, an output signal of the flash memory cell multiple times during the voltage gate change period to provide multiple samples; defining a given sample of the multiple samples as a data sample that represents data stored in the flash memory cell; and determining, by a processor that belongs to the die, a reliability of the data sample based on one or more samples of the multiple samples that differ from the given sample. The processor may belong to the sampling circuit or may not belong to the sampling circuit.

20 Claims, 16 Drawing Sheets

(56) References Cited

U.S. PATENT DOCUMENTS

| | | |
|---|---|---|
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris |
| 5,729,490 A | 3/1998 | Calligaro et al. |
| 5,740,395 A | 4/1998 | Wells |
| 5,745,418 A | 4/1998 | Hu et al. |
| 5,778,430 A | 7/1998 | Ish |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett |
| 7,388,781 B2 | 6/2008 | Litsyn |
| 7,395,404 B2 | 7/2008 | Gorobets et al. |
| 7,441,067 B2 | 10/2008 | Gorobets et al. |
| 7,443,729 B2 | 10/2008 | Li |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell |
| 7,619,922 B2 | 11/2009 | Li |
| 7,697,326 B2 | 4/2010 | Sommer et al. |
| 7,706,182 B2 | 4/2010 | Shalvi et al. |
| 7,716,538 B2 | 5/2010 | Gonzalez |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun |
| 7,961,797 B1 | 6/2011 | Yang et al. |
| 7,975,192 B2 | 7/2011 | Sommer |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 9,411,669 B2 * | 8/2016 | Reddy .................. G11C 16/349 |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama |
| 2002/0174156 A1 | 11/2002 | Birru |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri |
| 2006/0203587 A1 | 9/2006 | Li et al. |

(56) References Cited

U.S. PATENT DOCUMENTS

| | | |
|---|---|---|
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0270072 A1* | 10/2008 | Sukegawa .......... G11C 16/3418 702/179 |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0268517 A1* | 10/2009 | Murin .................. G11C 11/5628 365/185.03 |
| 2009/0282185 A1 | 11/2009 | Van Cauwenbergh |
| 2009/0282186 A1 | 11/2009 | Mokhlesi |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee |
| 2010/0180073 A1 | 7/2010 | Weingarten et al. |
| 2010/0199149 A1* | 8/2010 | Weingarten ......... G06F 11/1068 714/773 |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1* | 6/2011 | Weingarten ......... G06F 11/1048 714/755 |
| 2011/0194353 A1 | 8/2011 | Hwang |
| 2011/0209028 A1 | 8/2011 | Post |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |

(56) References Cited

U.S. PATENT DOCUMENTS

| | | | |
|---|---|---|---|
| 2012/0001778 A1 | 1/2012 | Steiner et al. | |
| 2012/0005554 A1 | 1/2012 | Steiner et al. | |
| 2012/0005558 A1 | 1/2012 | Steiner et al. | |
| 2012/0005560 A1 | 1/2012 | Steiner et al. | |
| 2012/0008401 A1 | 1/2012 | Katz et al. | |
| 2012/0008414 A1 | 1/2012 | Katz et al. | |
| 2012/0017136 A1 | 1/2012 | Ordentlich et al. | |
| 2012/0051144 A1 | 3/2012 | Weingarten et al. | |
| 2012/0063227 A1 | 3/2012 | Weingarten et al. | |
| 2012/0066441 A1 | 3/2012 | Weingarten | |
| 2012/0110250 A1 | 5/2012 | Sabbag et al. | |
| 2012/0124273 A1 | 5/2012 | Goss et al. | |
| 2012/0246391 A1 | 9/2012 | Meir | |
| 2015/0012802 A1* | 1/2015 | Avila | G06F 12/0246 714/773 |

OTHER PUBLICATIONS

Search Report of PCT Patent Application WO 2009/095902 A3, dated Mar. 4, 2010.
Search Report of PCT Patent Application WO 2009/078006 A3, dated Mar. 4, 2010.
Search Report of PCT Patent Application WO 2009/074979 A3, dated Mar. 4, 2010.
Search Report of PCT Patent Application WO 2009/074978 A3, dated Mar. 4, 2010.
Search Report of PCT Patent Application WO 2009/072105 A3, dated Mar. 4, 2010.
Search Report of PCT Patent Application WO 2009/072104 A3, dated Mar. 4, 2010.
Search Report of PCT Patent Application WO 2009/072103 A3, dated Mar. 4, 2010.
Search Report of PCT Patent Application WO 2009/072102 A3, dated Mar. 4, 2010.
Search Report of PCT Patent Application WO 2009/072101 A3, dated Mar. 4, 2010.
Search Report of PCT Patent Application WO 2009/072100 A3, dated Mar. 4, 2010.
Search Report of PCT Patent Application WO 2009/053963 A3, dated Mar. 4, 2010.
Search Report of PCT Patent Application WO 2009/053962 A3, dated Mar. 4, 2010.
Search Report of PCT Patent Application WO 2009/053961 A3, dated Mar. 4, 2010.
Search Report of PCT Patent Application WO 2009/037697 A3, dated Mar. 4, 2010.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips. com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
Jedec Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

Prior Art

Page 1100

| Payload Bits 1110 | ECC Bits A 1120 | ECC Bits B 1130 |
|---|---|---|

FIG. 13

FLASH MEMORY CHIP PROCESSING

RELATED APPLICATIONS

This application claims priority from U.S. provisional patent Ser. No. 62/188,672, filed on Jul. 5, 2015, which is incorporated herein by reference.

BACKGROUND

Nonvolatile flash memory devices (e.g. 2D NAND Flash or 3D NAND) store information in the form of charge in a flash memory cell. A flash memory cell has a transistor with an additional floating metal gate between the substrate and the transistors gate or a trapping area or any other mechanism to allow charge storage. The charge is stored in the transistor and is injected during an operation known as programming. The charge may be removed during an operation known as an erase operation.

As the charge in the transistor may vary contiguously, it is possible to store more than just one bit per flash transistor by using several charge levels to symbolize different sequences of bits.

FIG. 1 illustrates a prior art voltage level distribution 100 for a 3pbc (bits per cell) flash memory cell. The voltage level distribution includes eight lobes 101-108. Each lobe represents a 3-bit value.

The voltage level distributions of FIG. 1 illustrates non-overlapping lobes, however this is only schematic, and in practical cases the lobes may overlap. For NAND Flash devices, a stressed page, may introduce greater overlap between lobes than a new page, since after many program/erase (P/E) cycles or read disturb cycles the stress may introduce different noise sources. After a long duration, every lobe may have a larger standard deviation (std) and may have a different mean location. These effects are also known as retention.

The 3 bit-per-cell (bpc) cell includes a most significant bit (MSB), a central significant bit (CSB) and a least significant bit (LSB). A physical page of flash memory module may store three logical pages. This physical page is programmed one logical page after the other. The programming includes various types of programming such as MSB programming, CSB programming and LSB programming. Alternatively, all 3 pages in a row may be programmed at once in either a single stage or in several stages. For example, 3 stages may be used for programming such that all page types are associated with each stage. The logical pages are read by applying various types of read operations such as MSB read (e.g. in which a MSB threshold 111 and 115 are used), CSB read (in which two CSB thresholds 112 114 and 116 are used) and LSB read (in which four LSB thresholds 113 and 117 are used).

FIG. 2 shows similar distributions for the case of 2 bpc devices. Four lobes 201, 202, 203 and 204 as well as MSB threshold 212 and two LSB thresholds 211 and 312.

As mentioned, the lobe distributions are not constant throughout the life of the flash and change under various stress conditions. With retention, the distribution become larger and shift towards the erase level. The higher the distribution the larger the shift. This effectively shrinks the effective working window. Both the shrinkage of the window and the fattening of the distributions contribute to the increase in number of errors after performing a page read. FIG. 3 illustrates these effects. Spaced apart lobes 301 overlap and widen due to retention to provide threshold voltage distribution 302.

These effects become significantly worse as the block P/E cycles increase and as the NAND Flash memory technology node shrink.

These stress factors (Node shrink, number of layers in 3D NAND, endurance retention, read disturb) affect reliability due to errors incurred by overlap of lobes. To overcome these issues more advanced memory controllers use advanced ECC and DSP algorithms to overcome the errors incurred by these errors.

FIG. 4 shows a typical prior art NAND flash string and the reading circuitry associated with it. A string is duplicated many times (say 147456 times) in a block and contains several (say 86) Flash memory cells.

Each of the flash memory cells 420 of a string is associated with a different wordline which connects all of the corresponding flash memory cells in the other strings of the block. When a block is chosen, each string is connected to a corresponding bitline by turning on the Bit Line Select and the Ground Select transistors. When a read operation is performed, a sense amplifier 440 is connected to the bit-line and after allowing some time (say 40 uS) for the bit-line voltage to settle, the result is stored by a latch 450. Latch 450 is activated by latch enable (LE) signal. FIG. 4 illustrates a string of thirty two flash memory cells, positioned between a bit line select transistor (for selecting the string) and a ground select transistor (for grounding the string).

In order to measure the charge in a certain cell within a string, all other cells are switched on by applying a high voltage on their gates (given by Vbias) and a comparison voltage, Vth, is applied to the gate of the selected cell. In FIG. 4 the third flash memory cell 420(3) is selected and wordline3 is provided with Vth. Other flash memory cells (1, 2 and 4-32) are fed with Vbias.

If the cell is charged and Vth is not high enough, the gate will not allow current to flow and the sense-amplifier will output a "0". On the other hand, if the cell is not charge or Vth is high enough, current will flow and the sense-amplifier will output a "1". Different schemes may exist where the cell being samples is biased with a constant voltage (say Vcc) but in the sense-simplifier a comparison against a reference string is performed which reference value may be determined by some external voltage, Vth.

The bit line and each flash memory cells have certain impedance and capacitance that need to be charged in order to converge to a desired voltage level. This is illustrated in FIG. 5. Curve 510 illustrate the charging of the capacitance of the bit line and/or the selected flash memory cell once the threshold voltage converges and stabilizes to a first target value 520 a single sampling is performed by the latch 450.

The above sampling technique holds when a bit may be obtained only through a single threshold comparison. When more than a single threshold comparison is required, the above procedure may be performed for each threshold and the results may then be combined.

SUMMARY

According to an embodiment of the invention there may be provided a non-transitory computer readable medium that stores instructions that once executed by a computer cause the computer to sample a flash memory cell that belongs to a die, by attempting, during a gate voltage change period, to change a value of a gate voltage of the flash memory cell from a first value to a second value; sampling, by a sampling circuit that belongs to the die, an output signal of the flash memory cell multiple times during the voltage gate change period to provide multiple samples; defining a given sample of the multiple samples as a data sample that represents data stored in the flash memory cell; and determining, by a processor that belongs to the die, a reliability of the data sample based on one or more samples of the multiple samples that differ from the given sample. The processor may belong to the sampling circuit or may not belong to the sampling circuit.

According to an embodiment of the invention there may be provided a semiconductor die that may include a processor, a sampling circuit and a flash memory array; wherein the sampling circuit is configured to (a) attempt, during a gate voltage change period, to change a value of a gate voltage of the flash memory cell from a first value to a second value; and (b) sample an output signal of the flash memory cell multiple times during the voltage gate change period to provide multiple samples; wherein the processor is configured to define a given sample of the multiple samples as a data sample that represents data stored in the flash memory cell; and to determine a reliability of the data sample based on one or more samples of the multiple samples that differ from the given sample.

According to an embodiment of the invention there may be provided a method for sampling a flash memory cell that belongs to a die, the method may include attempting, during a gate voltage change period, to change a value of a gate voltage of the flash memory cell from a first value to a second value; sampling, by a sampling circuit that belongs to the die, an output signal of the flash memory cell multiple times during the voltage gate change period to provide multiple samples; defining a given sample of the multiple samples as a data sample that represents data stored in the flash memory cell; and determining, by a processor that belongs to the die, a reliability of the data sample based on one or more samples of the multiple samples that differ from the given sample.

The determining of the reliability may include searching for a difference between the multiple samples.

The determining of the reliability may include assigning a reliability score that is responsive to an order, within the multiple samples, of a first sample that differs from a preceding sample.

The method may include assigning a reliability score that represent a decrease in reliability with an increase in the order of the first sample.

The determining of the reliability may include assigning a first reliability score when all the samples have a same value; and assigning a second reliability score when one of the multiple samples differs from another sample; wherein the second reliability score is indicative of a lower reliability than the first reliability score.

The method further may include outputting, to a flash memory controller located outside the die, information about the reliability of the data sample.

The method may include decoding, by the processor, the data sample; wherein the decoding may include utilizing information, generated by the processor, related to the reliability of the data sample.

The method may include receiving, by the processor error correction information that was generated outside the die and relates to the data sample; and decoding, by the processor, the data sample; wherein the decoding may include (a) utilizing information, generated by the processor, related to the reliability of the data sample and (b) utilizing the error correction information.

The method may include controlling an execution of operations applied on the data sample in response to the reliability of the data sample.

The method may include preventing a copyback operation when the reliability of the data sample is below a reliability threshold.

The method may include selecting between an execution of a copyback operation and a provision of the data sample to an external flash memory controller based upon the reliability of the data sample.

The method may include determining an allocation of the flash memory cell based upon the reliability of the data sample.

According to an embodiment of the invention there may be provided a method for sampling a flash memory cell that belongs to a die, the method may include performing a first attempt, during a first gate voltage change period, to change a value of a gate voltage of the flash memory cell from a first value to a second value; sampling, by a sampling circuit that belongs to the die, an output signal of the flash memory cell multiple times during the first voltage gate change period to provide multiple first samples; defining a first given sample of the first multiple samples as a first data sample that represents data stored in the flash memory cell; determining, by a processor that belongs to the die, a reliability of the first data sample based on one or more samples of the first multiple samples that differ from the first given sample; performing a second attempt, during a second gate voltage change period, to change a value of a gate voltage of the flash memory cell from a first intermediate value to a third value; wherein the second attempt starts before a completion of the first attempt and when the gate voltage of the flash memory cell reached the first intermediate value; defining a second given sample of the second multiple samples as a second data sample that represents the data stored in the flash memory cell; and determining, by the processor, a reliability of the second data sample based on one or more samples of the second multiple samples that differ from the second given sample.

According to an embodiment of the invention there may be provided a non-transitory computer readable medium that stores instructions that once executed by a computer cause the computer to perform a first attempt, during a first gate voltage change period, to change a value of a gate voltage of the flash memory cell from a first value to a second value; sample an output signal of the flash memory cell multiple times during the first voltage gate change period to provide multiple first samples; define a first given sample of the first multiple samples as a first data sample that represents data stored in the flash memory cell; determine a reliability of the first data sample based on one or more samples of the first multiple samples that differ from the first given sample; perform a second attempt, during a second gate voltage change period, to change a value of a gate voltage of the flash memory cell from a first intermediate value to a third value; wherein the second attempt starts before a completion of the first attempt and when the gate voltage of the flash memory cell reached the first intermediate value; define a second given sample of the second multiple samples as a second data sample that represents the data stored in the flash memory cell; and determine a reliability of the second data sample based on one or more samples of the second multiple samples that differ from the second given sample.

According to an embodiment of the invention there may be provided a semiconductor die that may include a processor, a sampling circuit and a flash memory array; wherein the sampling circuit is configured to (a) perform a first attempt, during a first gate voltage change period, to change a value of a gate voltage of the flash memory cell from a first value to a second value; (b) sample an output signal of the flash memory cell multiple times during the first voltage gate change period to provide multiple first samples; wherein the processor is configured to (a) define a first given sample of the first multiple samples as a first data sample that represents data stored in the flash memory cell; (b) determine a reliability of the first data sample based on one or more samples of the first multiple samples that differ from the first given sample; (c) perform a second attempt, during a second gate voltage change period, to change a value of a gate voltage of the flash memory cell from a first intermediate value to a third value; wherein the second attempt starts before a completion of the first attempt and when the gate voltage of the flash memory cell reached the first intermediate value; (d) define a second given sample of the second multiple samples as a second data sample that represents the data stored in the flash memory cell; and (e) determine a reliability of the second data sample based on one or more samples of the second multiple samples that differ from the second given sample.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 13 illustrates a content of a page according to an embodiment of the invention.

DETAILED DESCRIPTION OF THE DRAWINGS

Figure 1:
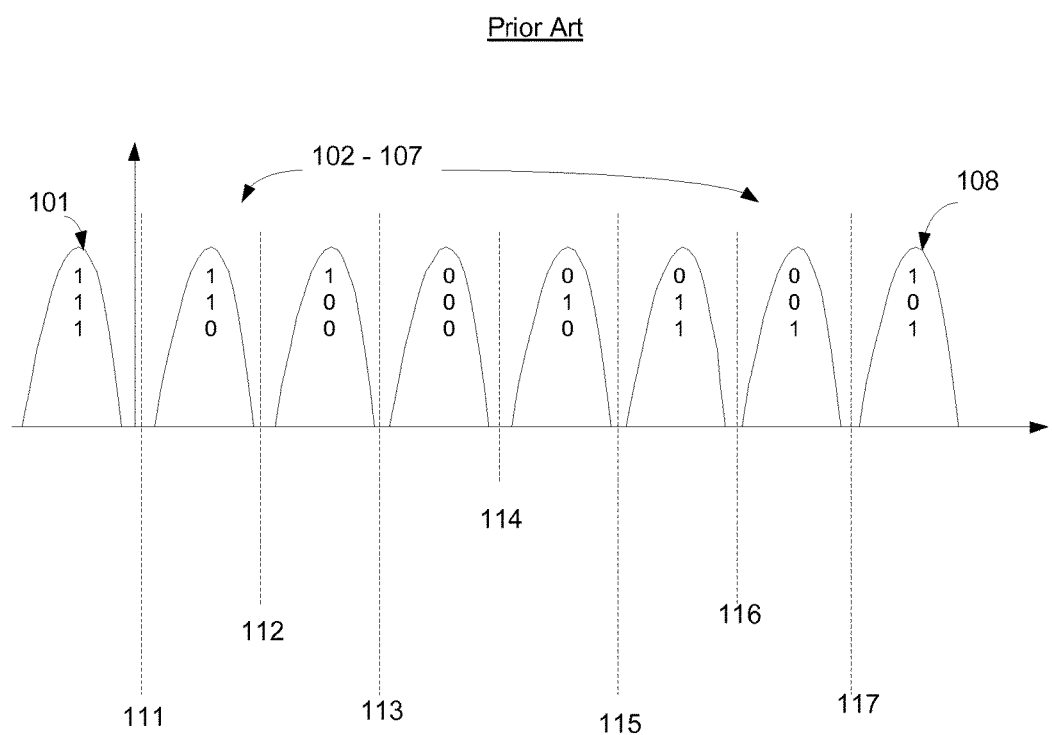
FIG. 1 illustrates a prior art threshold voltage distribution.
Figure 2:
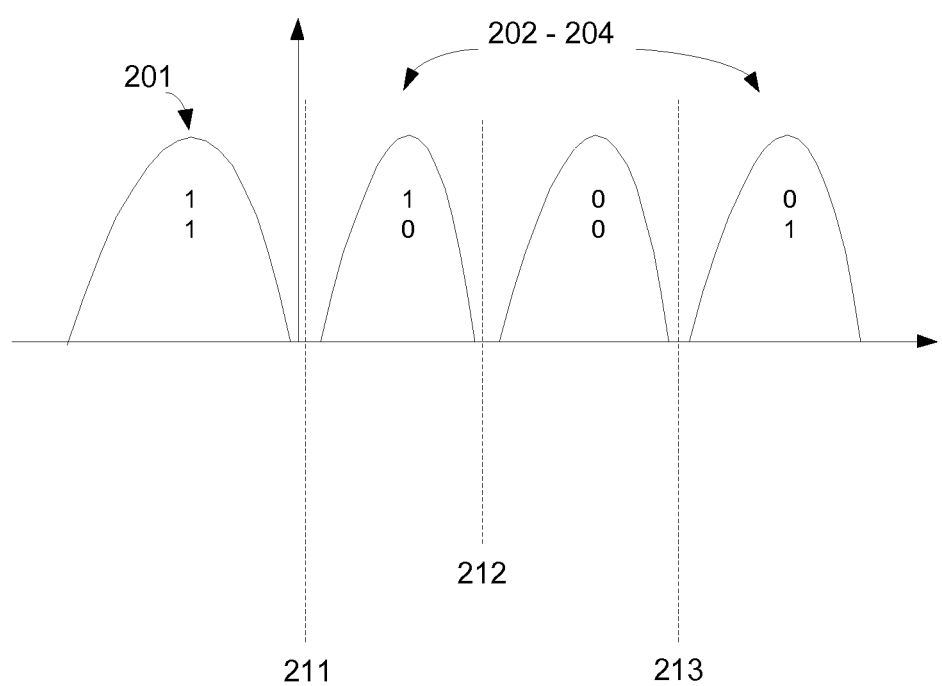
FIG. 2 illustrates a prior art threshold voltage distribution.
Figure 3:
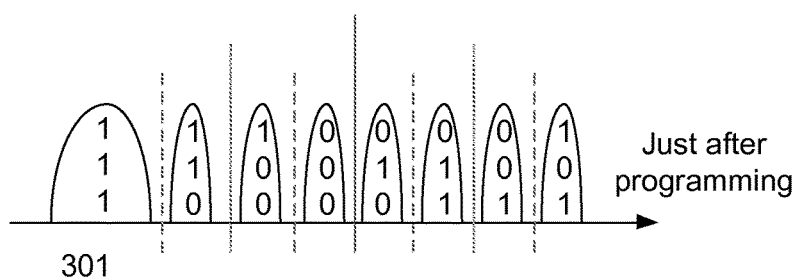
FIG. 3 illustrates a prior art threshold voltage distribution.
Figure 3:
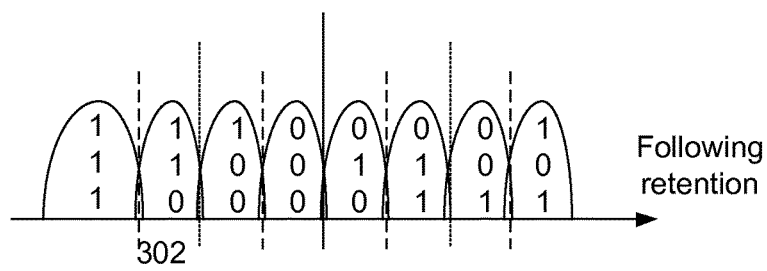
Figure 4:
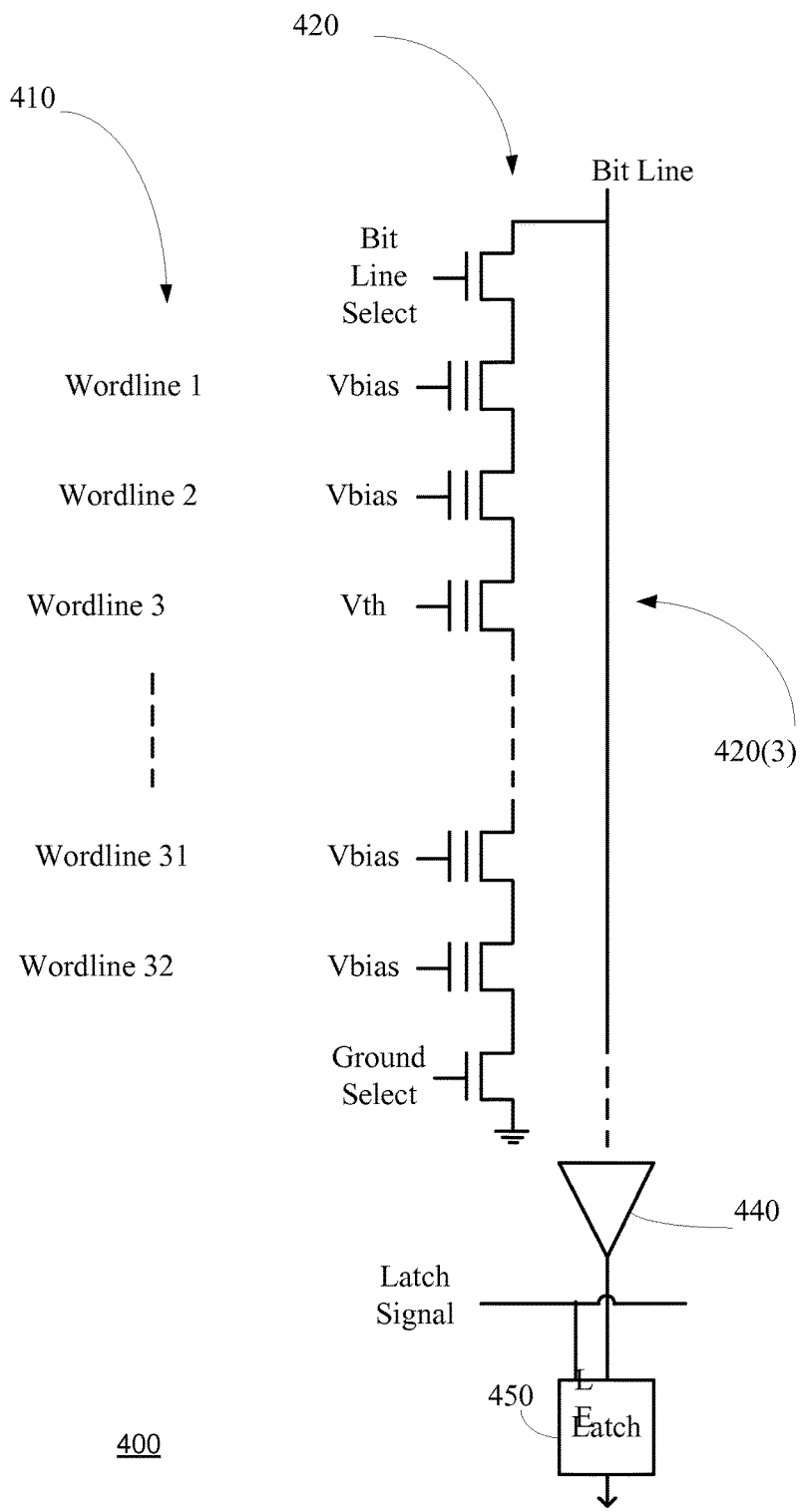
FIG. 4 illustrates a string of flash memory cells.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The following invention presents a few schemes for obtaining more than a single bit sense output per cell, in order to allow soft information to be outputted. In addition, this invention also presents methods for internally utilizing this soft information to allow outputting only hard information from the NAND but with higher reliability.

The terms "sample", "sampling point", "latching point" and "latch" are used in an interchangeable manner.

The terms "process" and "method" are used in an interchangeable manner.

According to an embodiment of the invention a die that includes flash memory cells (such as NAND flash memory cells) includes a processor such as an internal sampling processor.

The processor may be configured to obtain "soft" samples regarding the state of the device. This enabling better reliability at the decoder.

The internal soft sampling schemes described below have advantages over external "soft" sampling scheme managed by a NAND controller ASIC.

It is shown that internal soft information can be generated without requiring additional threshold sampling times. This saves a considerable latency incurred by "soft" sampling in an external controller. For example, in an external controller "soft" sampling may incur 7 or 31 NAND read operations, each requiring 90 uS for the read operation and additional data transfer time. However, the suggested methods involve an internal soft sampling operation that is performed within a single read operation (90 uS) and then only relevant data need to be output (only equivalent to 3 or 5 reads).

Semi-Soft Sampling

Figure 6:
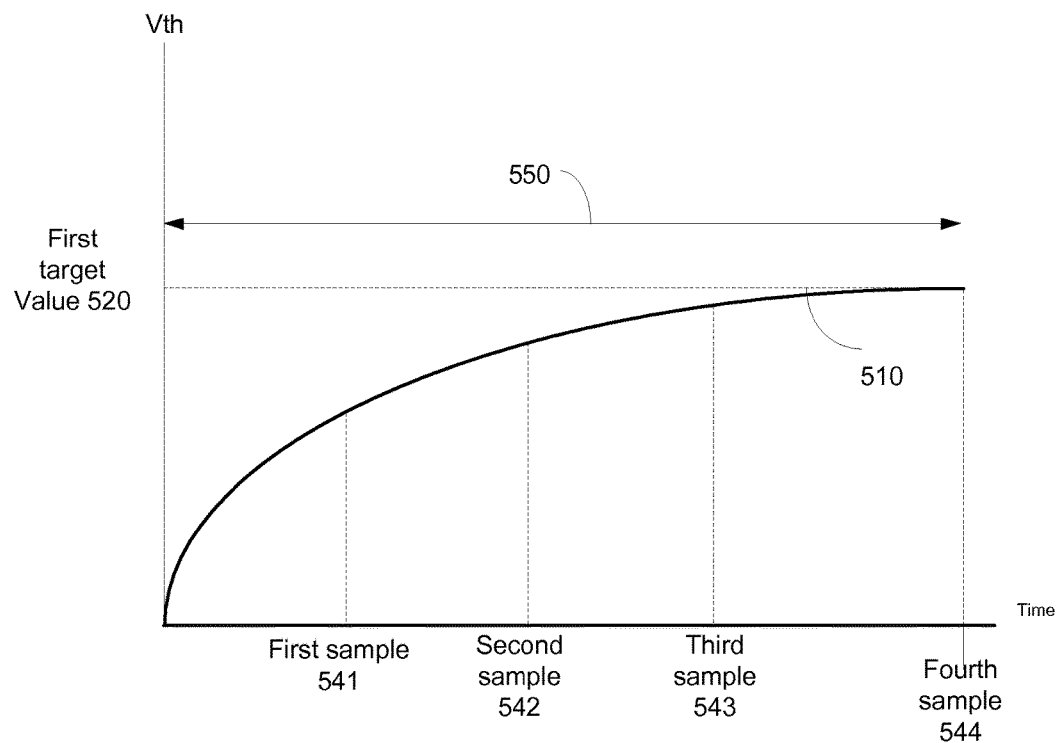
FIG. 6 illustrates a sampling process according to an embodiment of the invention.
Figure 7:
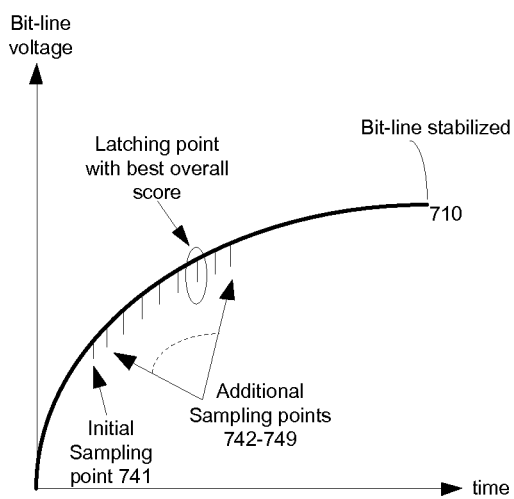
FIG. 7 illustrates a sampling process according to an embodiment of the invention.

FIGS. 6 and 7 illustrate a sampling process according to an embodiment of the invention.

In FIG. 6 there are four samples and in FIG. 7 there are more than four samples. The number of samples may be two or more, the spacing (time difference) between different samples may be the same but one or more spacing may differ from one or more other spacing.

Curve 510 of FIG. 6 illustrates that multiple samples are taken at multiple latching points 541, 542 and 543 prior to full stabilization of the threshold voltage. An additional sample is taken at a last latching point 544—when the threshold voltage is stabilized—reaches first target value 520.

Curve 710 of FIG. 7 illustrates an initial sampling point 741 followed by a plurality of additional sampling points 742-729.

The samples may be used to obtain semi-soft information. The sense amplifiers of a row may be latched several times prior to full stabilization.

Depending on the sampling time, the sampling point can be referenced to a different gate voltage, thus equivalent to sampling with different thresholds.

Regardless of the actual voltage that is being sampled, it is clear that NAND strings that are latched (change their value) early on to their final values are likely to be more reliable than those that were only latched (changed their value) during the final stages. Therefore, the method can assign different reliability values depending on when the latched signals reached their final values—when a change occurred (or at an absence of change—the first sample may be regarded as very reliable).

One method of doing this is by holding a number of latch buffers.

Figure 8:
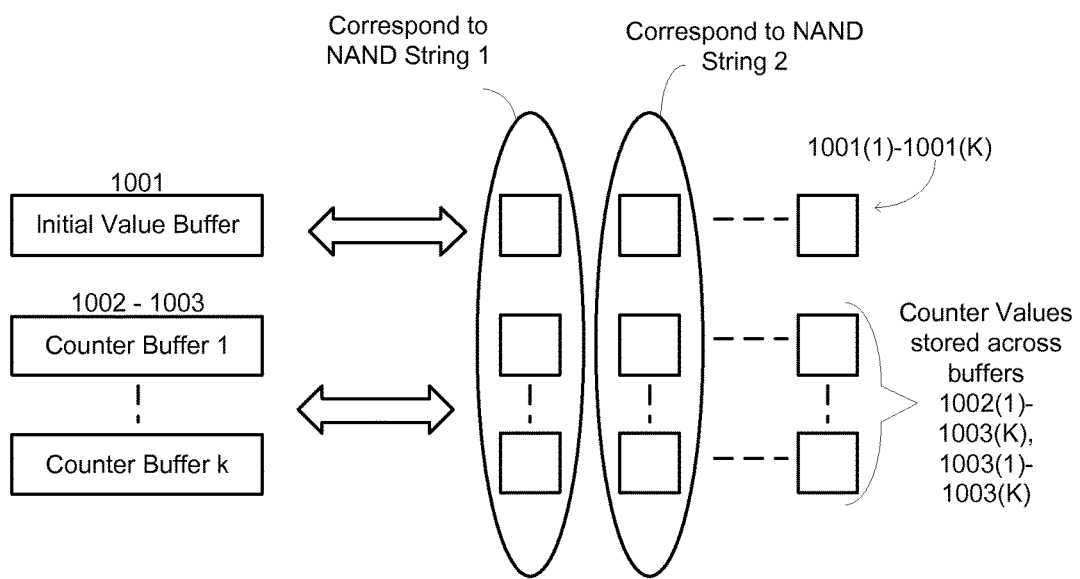
FIG. 8 illustrates a sampling buffers according to an embodiment of the invention.

FIG. 8 depicts multiple buffers according to an embodiment of the invention.

The buffers include an Initial Value Buffer (1001) that holds the data samples and Counter Buffers (1002-1003) that hold reliability information such as a reliability indicator. Each bit (bits 1001(1)-1001(K) of initial value buffer 1001; bits 1002(1)-1002(K) of counter buffer 1003 and bits 1003(1)-1003(K) of counter buffer 1003) in each of the buffers corresponds to a different NAND string and is intended to latch data which is a function of the corresponding NAND string sense amplifier value. The number of counter buffers is equal to the upper integer log 2 value of the number of sampling points. For example, if 4 sampling points are intended till gate stabilization, then we will use 2 counter buffers.

Figure 9:
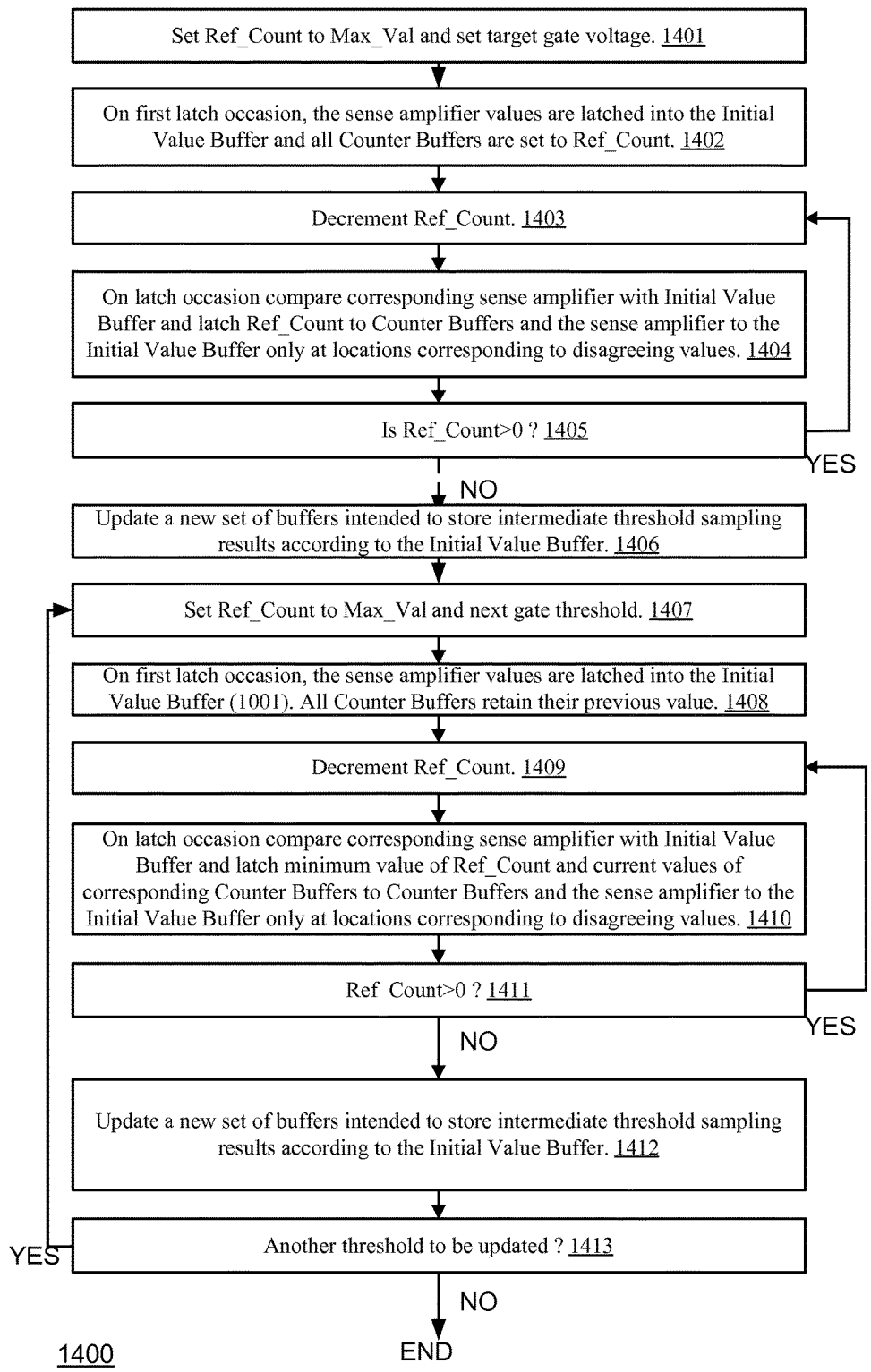
FIG. 9 illustrates a method according to an embodiment of the invention.

The latching procedure (1400) performed by the acquisition processor is illustrated in FIG. 9 and includes:

Set Ref_Count to Max_Val and set target gate voltage. (1401).

On first latch occasion, the sense amplifier values are latched into the Initial Value Buffer (1401) and all Counter Buffers are set to Ref_Count. (1402).

Decrement Ref_Count. (1403).

On latch occasion compare corresponding sense amplifier with Initial Value Buffer and latch Ref_Count to Counter Buffers and the sense amplifier to the Initial Value Buffer only at locations corresponding to disagreeing values. (1404)

If Ref_Count>0 return to step 1403. (1405).

This latching procedure can be further extended to the case where more than a single threshold voltage is used. This is done by adding following steps:

Update a new set of buffers (Initial value buffer, new one for each threshold) intended to store intermediate threshold sampling results according to the Initial Value Buffer. (1406).

Set Ref_Count to Max_Val and next gate threshold. (1407).

On first latch occasion, the sense amplifier values are latched into the new Initial Value Buffer (1001). All Counter Buffers retain their previous value. (1408) Decrement Ref_Count. (1409).

On latch occasion compare corresponding sense amplifier with new Initial Value Buffer and latch minimum value of Ref_Count and current values of corresponding Counter Buffers to Counter Buffers and the sense amplifier to the new Initial Value Buffer only at locations corresponding to disagreeing values. (1410).

If Ref_Count>0 return to step 1409. (1411).

Update a new set of buffers intended to store intermediate threshold sampling results according to the Initial Value Buffer. (1412).

If another threshold needs to be updated, go to step 1407. (1413)

The procedure so far mainly considered the case where the final setting voltage of the gate is the same as the reference voltage. However, we can also set the final setting voltage of the gate to be above the actual reference voltage such that the gate voltage crosses the reference voltage, starting from below and ending at a higher point. In that case, it is no longer correct to say that the earlier the sense amplifier reads are stabilized the more reliable the read is. In fact, now, the furthest the voltages stabilize compared to the point in time the gate voltage reaches the reference voltage, the more reliable the read is.

Figure 16:
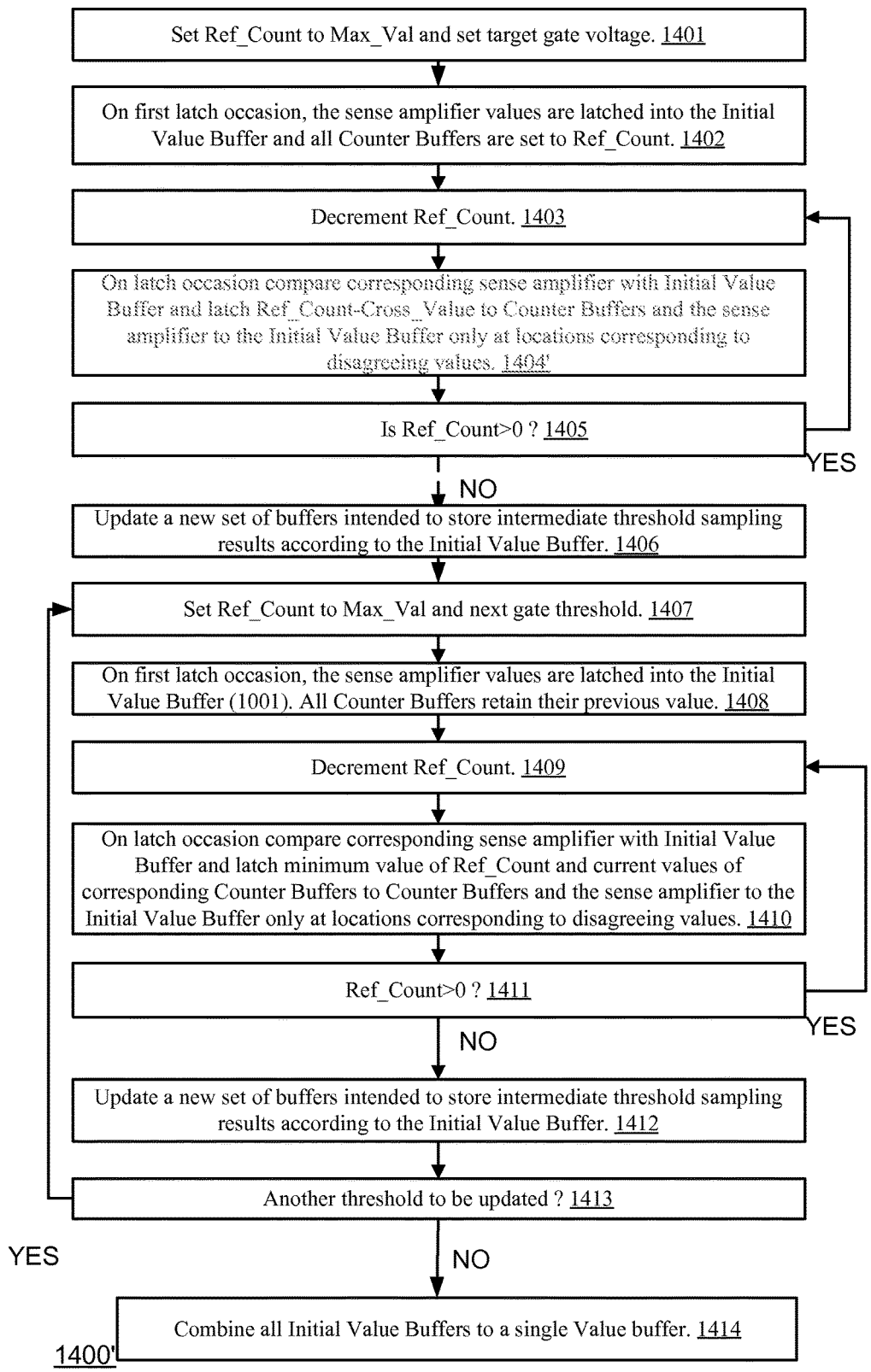
FIG. 16 illustrates a method according to an embodiment of the invention.

Thus, the following latching procedure can be applied:

The latching procedure (1400') performed by the acquisition processor is illustrated in FIG. 16 and includes:

Set Ref_Count to Max_Val and set target gate voltage. (1401).

On first latch occasion, the sense amplifier values are latched into the Initial Value Buffer (1401) and all Counter Buffers are set to Ref_Count. (1402).

Decrement Ref_Count. (1403).

On latch occasion compare corresponding sense amplifier with Initial Value Buffer and latch Ref_Count-Cross_Value to Counter Buffers and the sense amplifier to the Initial Value Buffer only at locations corresponding to disagreeing values. (1404')

If Ref_Count>0 return to step 1403. (1405).

Note that the latched value now has a sign which indicates the hard decision value of the read. This signed value replaces the need to use the initial Value buffer for obtaining the read result sign.

This latching procedure can be further extended to the case where more than a single threshold voltage is used. This is done by adding following steps:

a. Update a new set of buffers (Initial value buffer, new one for each threshold) intended to store intermediate threshold sampling results according to the Initial Value Buffer. (1406).

b. Set Ref_Count to Max_Val and next gate threshold. (1407).

c. On first latch occasion, the sense amplifier values are latched into the new Initial Value Buffer (1001). All Counter Buffers retain their previous value. (1408)

d. Decrement Ref_Count. (1409).

e. On latch occasion compare corresponding sense amplifier with new Initial Value Buffer and latch minimum value of Ref_Count and current values of corresponding Counter Buffers to Counter Buffers and the sense amplifier to the new Initial Value Buffer only at locations corresponding to disagreeing values. (1410).

f. If Ref_Count>0 return to step 1409. (1411).

g. Update a new set of buffers intended to store intermediate threshold sampling results according to the Initial Value Buffer. (1412).

h. If another threshold needs to be updated, go to step 1407. (1413)

i. Combine all Initial Value Buffers to a single Value buffer using a table (1414). For example, for reading the middle page in FIG. 1, 3 thresholds are used, and assuming that the above scheme is used to read threshold one after the other, we can use the following table-describing the initial value buffer.

| A | B | C | Final |
|---|---|---|-------|
| 0 | 0 | 0 | 0 |
| 0 | 0 | 1 | 1 |
| 0 | 1 | 0 | 1 or 0 |
| 0 | 1 | 1 | 0 |
| 1 | 0 | 0 | 1 or 0 |
| 1 | 0 | 1 | 1 |
| 1 | 1 | 0 | 1 or 0 |
| 1 | 1 | 1 | 1 |

It should be noted that here as well we can adapt the procedure to the case where the final gate voltage is set above the reference voltage. This is done by modifying step 10 such that we latch the minimum of Ref_Count−Cross_value and current counter buffers value only if abs(Ref_Count−Cross_value) is smaller than abs(current counter buffers). We need to save in the end the value of the sign that is latched At the end of this process the bit value is stored in the new set of buffers intended to store intermediate threshold and the reliability score is stored at the Counter Buffers. These buffers can now be output to an external controller to be used during soft decoding.

In a nut shell, a data storing buffer such as initial value buffer 101 may store the data sampled from multiple flash memory cells during an initial sample (or any other selected sample) while one or more other buffers store reliability information such as a sample in which the value of a flash memory cell changed.

Figure 11:
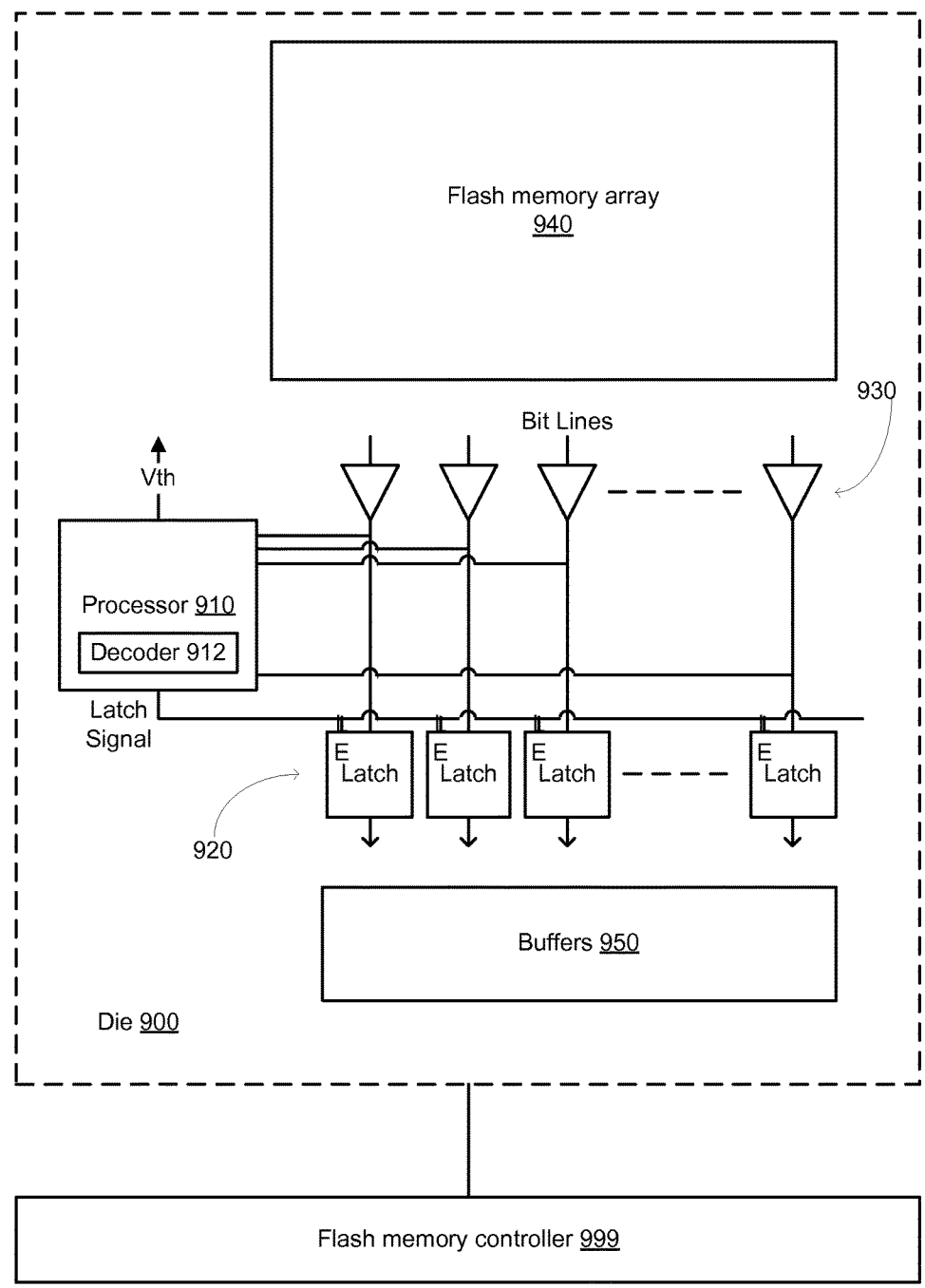
FIG. 11 illustrates a die and a flash memory controller according to an embodiment of the invention.

FIG. 11 illustrates die 900 and a flash memory controller 999 according to an embodiment of the invention.

The die 900 includes flash memory array 940, sense amplifiers 930, latches 920, buffers 950 and processor 910.

Sense amplifiers 930, buffers 950 and latches 920 form a sampling circuit. The sampling circuit may include processor 920 but this is not necessarily so.

Processor 920 may be a sampling processor but may have other functionalities such as decoding (see decoder 912).

Processor 920 may determine the value of gate thresholds.

Buffers 950 may include buffers 1001, 1002 and 1003 of FIG. 8 but may be other and/or additional buffers. Buffers 950 may store data samples and information about the reliability of the data samples.

Full Soft Sampling

The method can modify the NAND gate threshold values prior to gate voltage stabilization, while the voltage is still rising or dropping in a near linear manner.

By modifying the threshold (VT) voltage the method can keep the voltages continuously rising (dropping) nearly linearly in a region around the target threshold. Since the method can predict how the threshold change at each sample point we need to check whether the sense amplifier state changed from 0 to 1 and record the point at which it changed to 0 (or 1 if the voltages are dropping).

Figure 12:
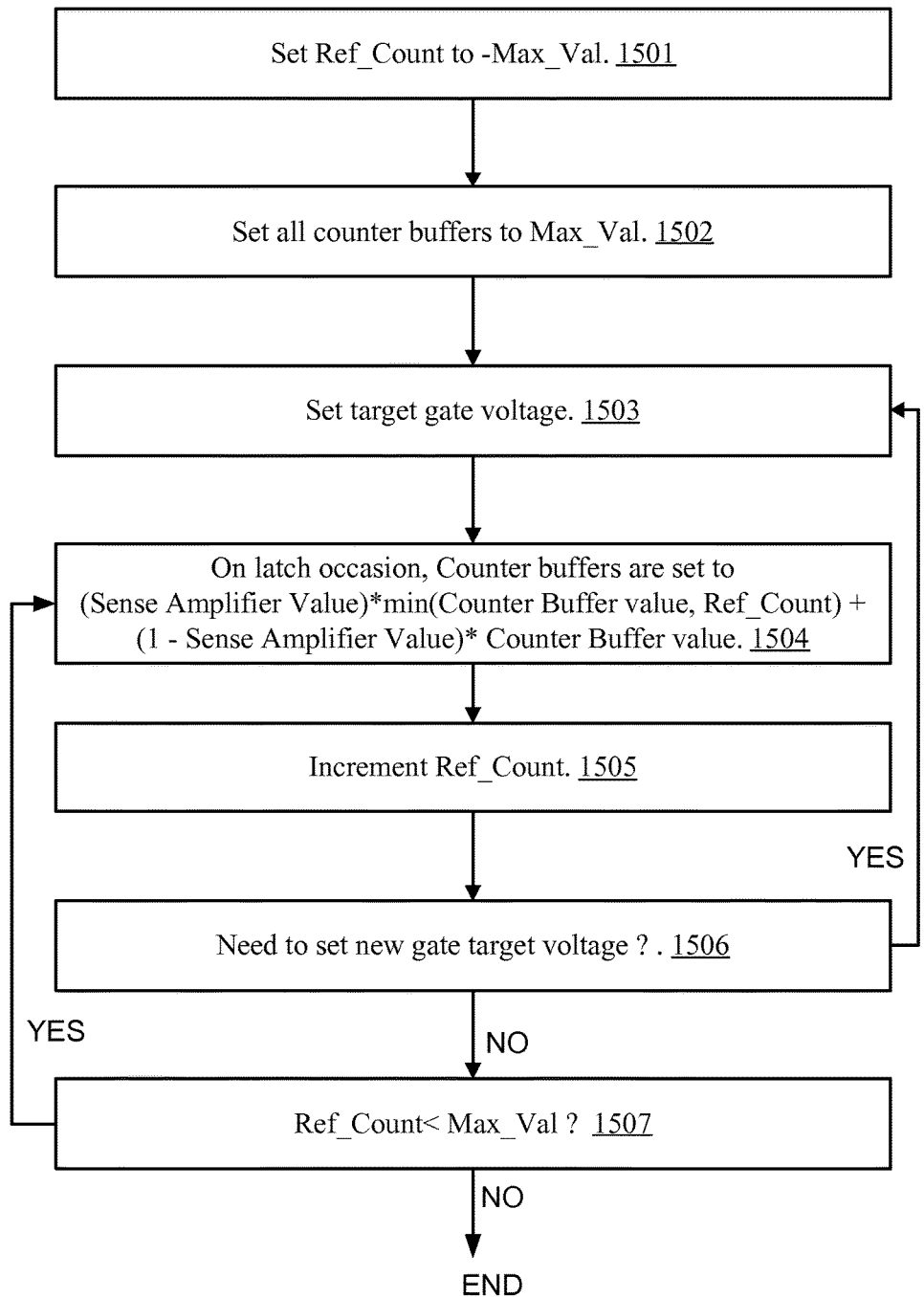
FIG. 12 illustrates a method according to an embodiment of the invention

Thus, the flow (denoted 1500 in FIG. 12) will work as follows:

Set Ref_Count to −Max_Val. (1501).

Set all counter buffers to Max_Val. (1502).

set target gate voltage. (1503).

On latch occasion, Counter buffers are set to (Sense Amplifier Value)*min(Counter Buffer value, Ref_Count)+(1−Sense Amplifier Value)*Counter Buffer value. (1504).

Increment Ref_Count. (1505).

If Need to set new gate target voltage, go to step 1503. (1506)

If Ref_Count<Max_Val return to step 1504. (1507).

The method can modify the NAND gate voltages values prior to gate voltage stabilization, while the gate voltage is still rising or dropping in a near linear manner.

By modifying the gate voltage the method can keep the voltages continuously rising (dropping) nearly linearly in a region around the target threshold. Since the method can predict how the threshold change at each sample point we need to check whether the sense amplifier state changed from 0 to 1 and record the point at which it changed to 0 (or 1 if the voltages are dropping).

If few thresholds (not including the soft threshold mentioned above) are involved in the page read, then above procedure follows for all those thresholds but we output only the closest value to 0 of all reads. Note that all procedures may share the same Counter Buffers.

Figure 10:
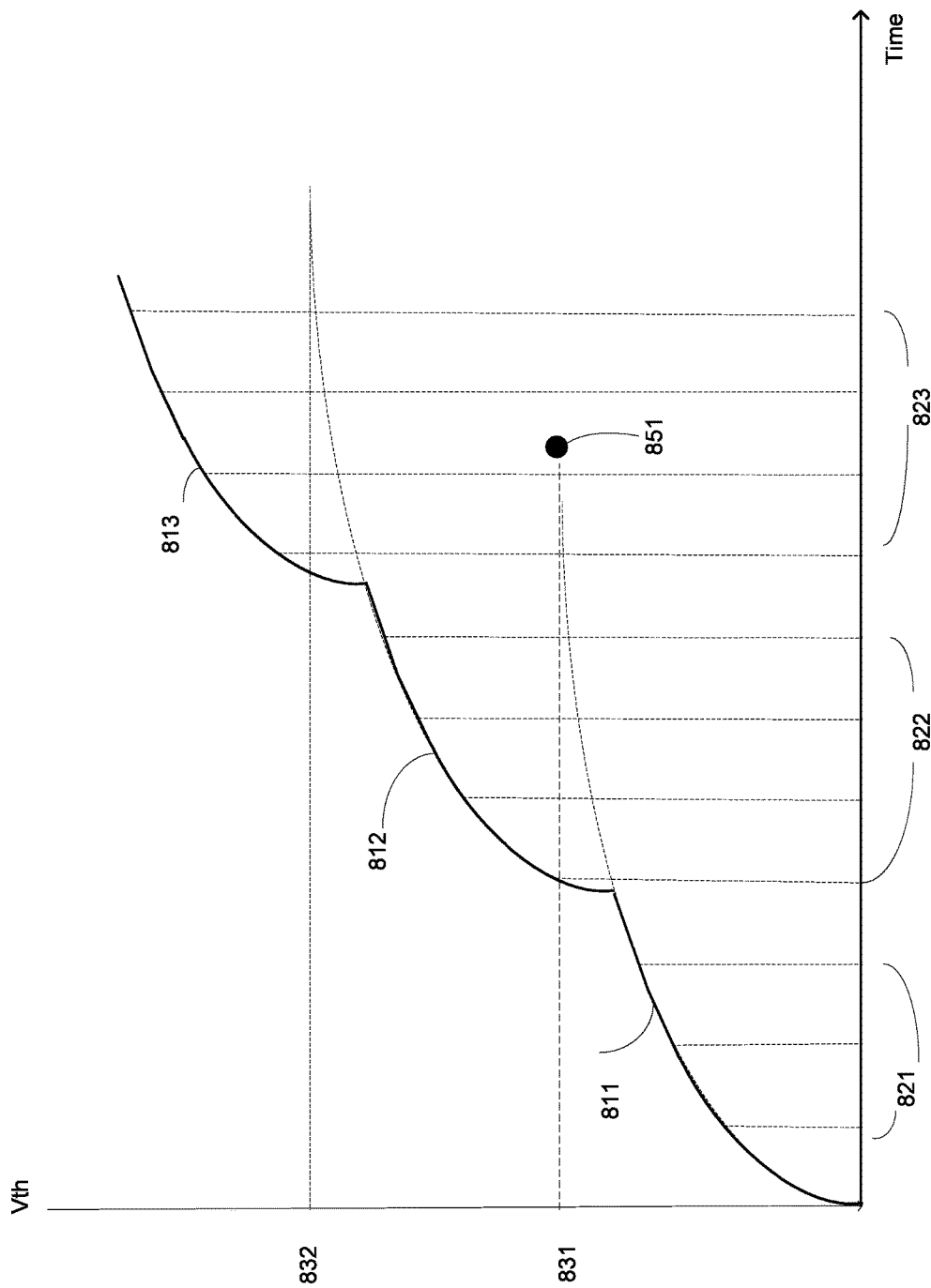
FIG. 10 illustrates a sampling process according to an embodiment of the invention.

FIG. 10 illustrates three iterations of attempts to change a gate voltage and multiple sampling operations, wherein the second attempt starts before the first attempt is completed and the third attempt starts before the second attempt is completed. The may be two or more iterations.

The change of threshold voltage during the first attempt is denoted 811. The change of threshold voltage during the second attempt is denoted 812. The change of threshold voltage during the third attempt is denoted 813.

The sampling points included in the first attempt are denoted 821.

The sampling points included in the second attempt are denoted 822.

The sampling points included in the third attempt are denoted 823.

The time of convergence of the first attempt (it the first attempt was allowed to be completed) is denoted 851 and exceeds the beginning of the second attempt and even the beginning of the third attempt.

All procedures may be managed by processor 910 of FIG. 11.

Figure 5:
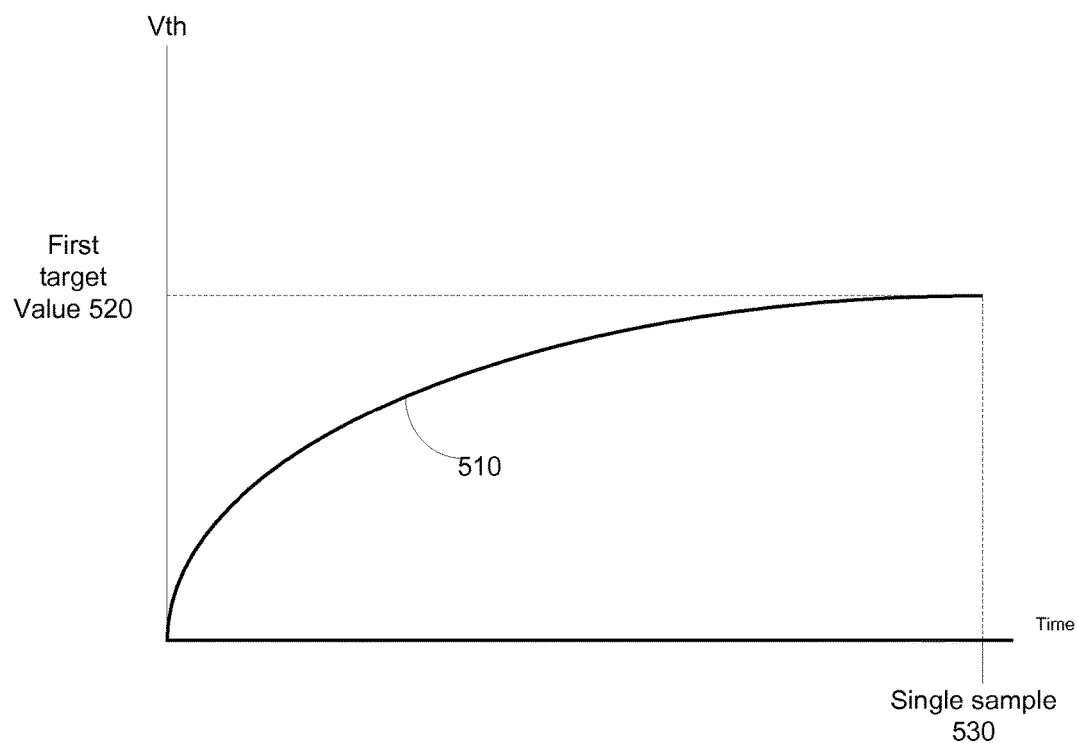
FIG. 5 illustrates a prior art sampling process.

It is noted that the aggregate duration (DT1) of multiple (N1) attempts is smaller than the aggregate duration (DT2) of the same number (N1) of prior art read cycle (such as illustrated in FIG. 5). The ratio between DT2 and DT1 may range between about N1 and a fraction of N1.

Internal Partial Decoding Capability

On top of performing internal soft decoding the method can utilize it to perform at least partial soft decoding capabilities. There can be provided a sharing of some of the ECC bits with the external controller. By utilizing soft information the method can perform more reliable decoding, even with part of the ECC bits. Thus, decoding can be done internally, in the NAND device, possibly while outputting a codeword, and output only Hard information from the NAND device. This way, not only did we perform fast soft sampling but also, we only output hard data, which requires less traffic on the NAND channel, and allow the controller to perform hard decoding based on much more reliable bits.

FIG. 13 depicts an example of a page 1100 which is divided into payload bits 1110, ECC bits A 1120 and ECC bits B 1130.

The external controller may utilize both A and B bits for decoding when using soft and hard bits. However, internal to the NAND device we may utilize only some of the ECC bits (say ECC A) in order to support less complex decoding at the NAND that could be performed while data is being outputted or sampled. In case of failures, the external controller could access the soft information of all bits and decode based on all ECC bits. One example of such an encoding scheme may be that of product codes where ECC A bits may be those of columns or rows. And full decoding based on both A and B bits and would be performed in iterative manner.

In addition codewords used internally to the NAND may be longer than codewords used at the controller level without penalty of transferring the extra data on the NAND channel.

Internal Reliability Detection

The method can also use the internally obtained soft information to understand the page read reliability. If more bits were detected as not reliable, the method can enable a status on the NAND device indicating that the operation was not reliable. For this purpose the method can also use some of the ECC bits as described in the previous section.

This information on reliable reads could be used to enable more efficient read flows at the controller. For example, going directly into soft decode flow instead of first going through hard decode flow.

In addition this could indicate that a copyback operation is not reliable (for example from SLC to TLC) and the data should first go to the controller, be decoded and then written back to NAND device.

For example, the die may receive a request (from a flash memory controller outside the die) to execute a copyback operation (during which data is copied within the flash memory array without exiting the die) and the processor may refuse to execute the copyback operation.

Redundant Pages/Rows/Planes

On some NAND devices, some blocks exhibit redundant rows or redundant planes or even page types within a row. These redundant pages/rows/planes are typically found at the edges of the block and no data is stored on them because they are less reliable. These pages are less reliable because they may suffer from higher distortion or higher interference or edge effects.

However, with the higher reliability due to internal soft, the method can return to use these pages to store data. The method can also use lower coding rates on these pages to overcome some of the reliability issues.

Figure 14:
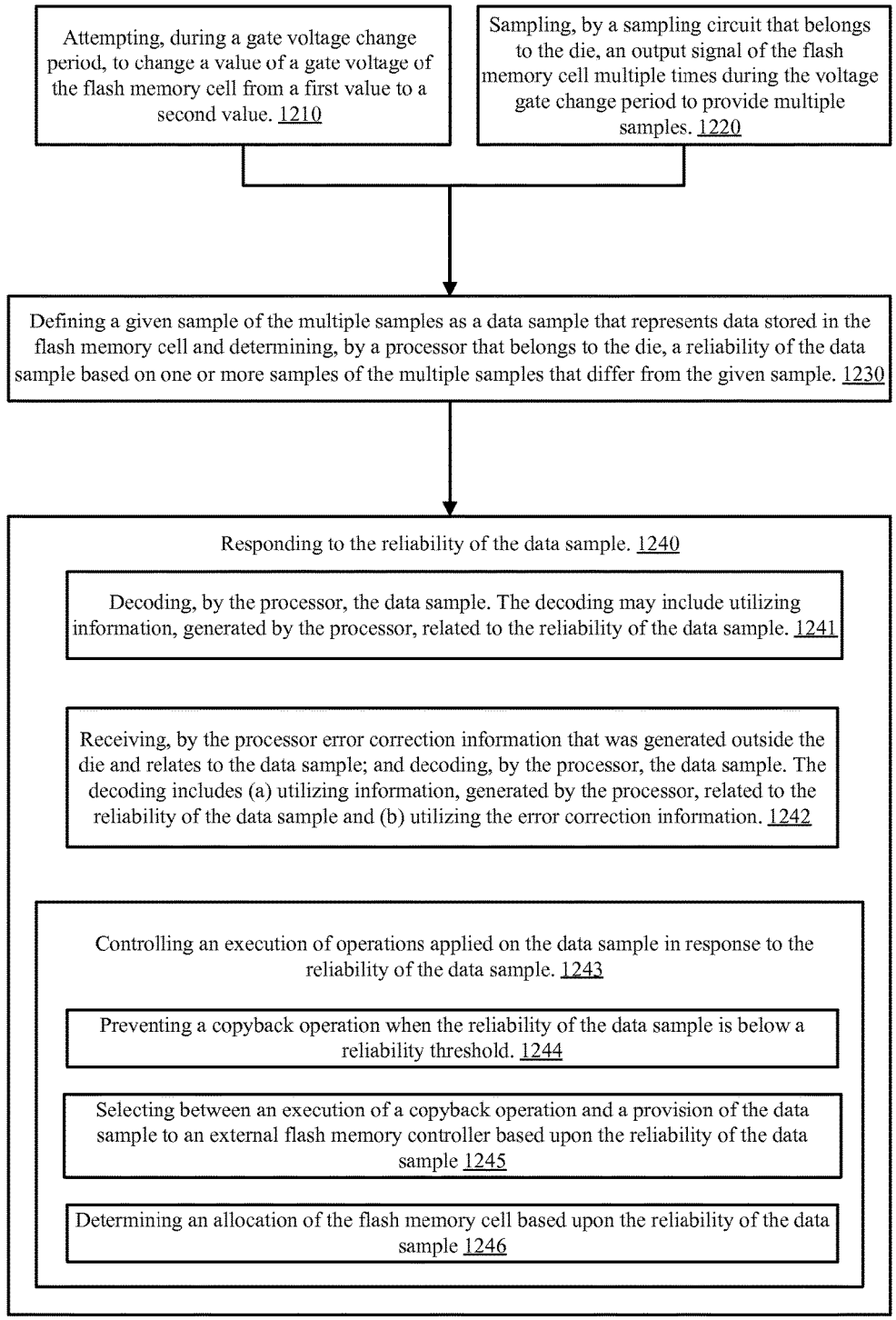
FIG. 14 illustrates a method according to an embodiment of the invention.

This is illustrated, for example, by step 1246 of FIG. 14 that includes determining an allocation of the flash memory cell based upon the reliability of the data sample. The determining may be executed by the processor and/or by a flash memory controller—in response to reliability information sent to the flash memory controller from the die.

Furthermore, we may use these pages not to increase capacity but to increase the overall redundancy in the system. Thus, though capacity increase may be little, the reliability improvement may be great.

FIG. 14 illustrates method 1200 according to an embodiment of the invention.

Method 1200 may start by steps 1210 and 1220.

Step 1210 may include attempting, during a gate voltage change period (such as voltage change period 550), to change a value of a gate voltage of the flash memory cell from a first value to a second value. For example, a gate voltage of the flash memory cell has to be changed to a second value (such as first target value 520 of FIG. 6). Due to the capacitance of a flash memory cell and the bitline the change of gate voltage takes time.

Step 1220 may include sampling, by a sampling circuit that belongs to the die, an output signal of the flash memory cell multiple times during the voltage gate change period to provide multiple samples. See, for example samples 541, 542, 543 and 544 of FIG. 6, initial sampling point 741 and additional sampling points 724-729 of FIG. 7.

Steps 1210 and 1220 may be followed by step 1230 of defining a given sample of the multiple samples as a data sample that represents data stored in the flash memory cell and determining, by a processor that belongs to the die, a reliability of the data sample based on one or more samples of the multiple samples that differ from the given sample.

Step 1230 may include at least one of the following:
a. Determining of the reliability comprises searching for a difference between the multiple samples.
b. Assigning a reliability score that is responsive to an order, within the multiple samples, of a first sample that differs from a preceding sample.
c. Assigning a reliability score that represents a decrease in a reliability with an increase in the order of the first sample.
d. Assigning a first reliability score when all the samples have a same value.
e. Assigning a second reliability score when one of the multiple samples differs from another sample. The second reliability score is indicative of a lower reliability than the first reliability score.

Step 1230 may be followed by steps 1210 and 1220—for reading another flash memory cell.

Alternatively, steps 1210, 1220 and 1230 are executed in parallel on multiple flash memory cells (such as but not limited to a page of flash memory cells). Accordingly, method 1200 may include:
a. Step 1210 may include attempting, during a gate voltage change period (such as voltage change period 550), to change values of gate voltages of multiple flash memory cells from a first value to a second value.
b. Step 1220 may include sampling, by a sampling circuit that belongs to the die, each output signal of multiple output signals of the multiple flash memory cells multiple times during the voltage gate change period to provide multiple samples per flash memory cell.
c. Step 1230 of defining, for each of the multiple flash memory cells, a given sample of the multiple samples (of the flash memory cell) as a data sample that represents data stored in the flash memory cell and determining, by a processor that belongs to the die, a reliability of the data sample (of each flash memory cell) based on one or more samples of the multiple samples that differ from the given sample.

Step 1230 may be followed by step 1240 of responding to the reliability of the data sample.

Step 1240 may include at least one of the following:

a. Decoding (1241), by the processor, the data sample. The decoding may include utilizing information, generated by the processor, related to the reliability of the data sample. The decoding usually takes place when multiple flash memory cells are read.

b. Receiving (1242), by the processor error correction information that was generated outside the die and relates to the data sample; and decoding, by the processor, the data sample. The decoding includes (a) utilizing information, generated by the processor, related to the reliability of the data sample and (b) utilizing the error correction information.

c. Controlling (1243) an execution of operations applied on the data sample in response to the reliability of the data sample.

Step 1243 may include at least one out of:

a. Preventing a copyback operation when the reliability of the data sample is below a reliability threshold. (1244)

b. Selecting between an execution of a copyback operation and a provision of the data sample to an external flash memory controller based upon the reliability of the data sample (1245).

c. Determining an allocation of the flash memory cell based upon the reliability of the data sample (1246).

Figure 15:
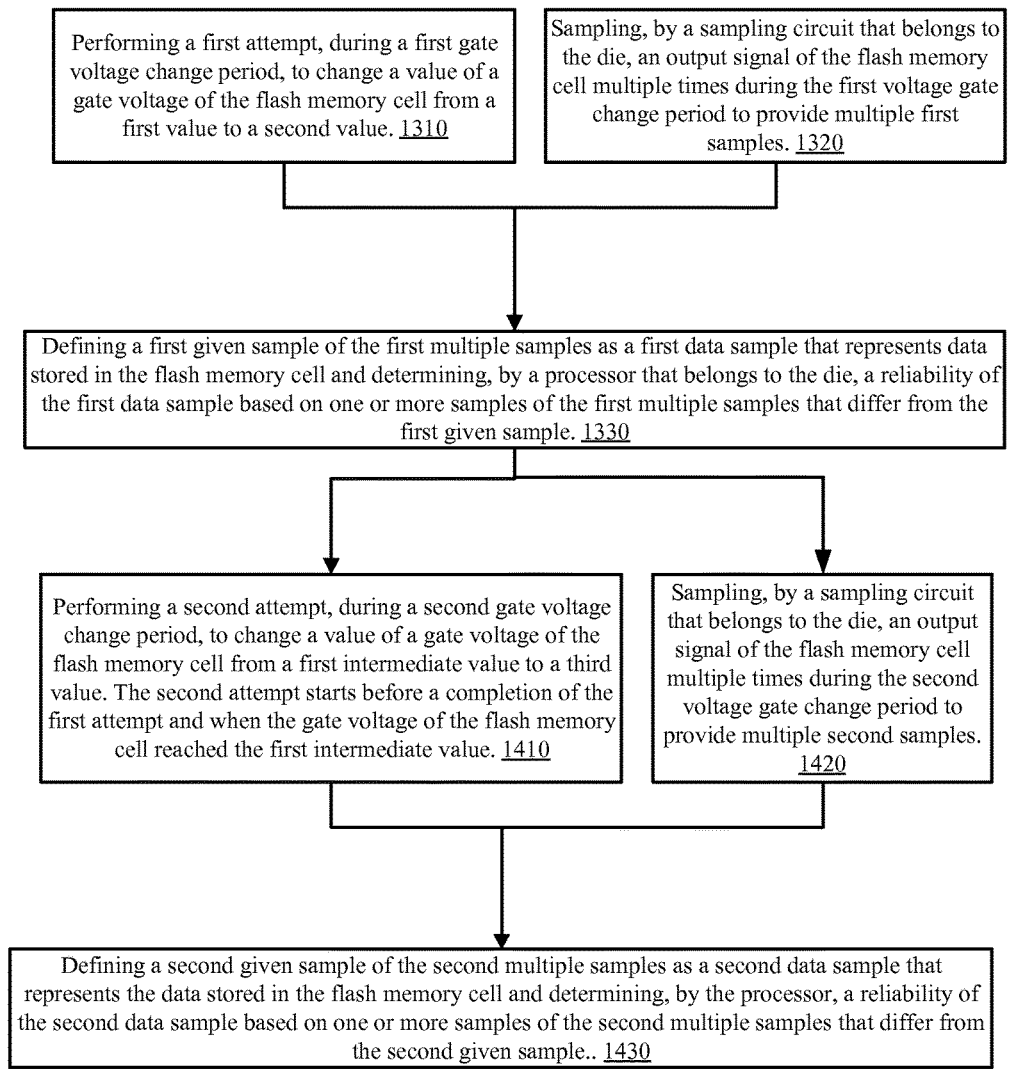
FIG. 15 illustrates a method according to an embodiment of the invention.

FIG. 15 illustrates method 1300 according to an embodiment of the invention.

Method 1300 may start by steps 1310 and 1320.

Step 1310 may include performing a first attempt, during a first gate voltage change period, to change a value of a gate voltage of the flash memory cell from a first value to a second value. See, for example, an attempt to change the gate voltage to equal first target level 831 of FIG. 9.

Step 1310 may be followed by steps 1320 and 1330.

Step 1320 may include sampling, by a sampling circuit that belongs to the die, an output signal of the flash memory cell multiple times during the first voltage gate change period to provide multiple first samples. See, for example sampling points 821 of FIG. 9.

Steps 1310 and 1320 may be followed by step 1330 of defining a first given sample of the first multiple samples as a first data sample that represents data stored in the flash memory cell and determining, by a processor that belongs to the die, a reliability of the first data sample based on one or more samples of the first multiple samples that differ from the first given sample.

Steps 1310 and 1320 (or step 1330) may be followed by steps 1410 and 1420.

Step 1410 may include performing a second attempt, during a second gate voltage change period, to change a value of a gate voltage of the flash memory cell from a first intermediate value to a third value. The second attempt starts before a completion of the first attempt and when the gate voltage of the flash memory cell reached the first intermediate value. Referring to FIG. 9—the second attempt is denoted 812 and starts execution before the first attempt is completed (imaginary point in time 851).

Step 1420 may include sampling, by a sampling circuit that belongs to the die, an output signal of the flash memory cell multiple times during the second voltage gate change period to provide multiple second samples.

Steps 1410 and 1420 may be followed by step 1430 of defining a second given sample of the second multiple samples as a second data sample that represents the data stored in the flash memory cell and determining, by the processor, a reliability of the second data sample based on one or more samples of the second multiple samples that differ from the second given sample.

Steps 1410 and 1420 and/or step 1430 may be followed by steps 1410 and 1420 multiple times.

Step 1430 may be executed for multiple iterations of steps 1410 and 1420 after the completion of the multiple iterations or during the multiple iterations. FIG. 10 illustrates a single addition repetition (curve 813) of steps 1410 and 1420—each repetition starts before the previous repetition reaches the target gate voltage.

It is noted that step 1330 and/or step 1430 may be followed by step 1230 of responding to the reliability of the data sample taken during corresponding steps 1320 and 1420.

Method 1300 may be executed for multiple flash memory cells—in a sequential and/or parallel manner. For example—flash memory cells of a row of flash memory cells of a flash memory cell array may be undergo method 1300 at the same time.

Each one of steps 1330 and 1430 may include at least one out of:

1) Determining of the reliability comprises searching for a difference between the multiple samples.

2) Assigning a reliability score that is responsive to an order, within the multiple samples, of a first sample that differs from a preceding sample.

3) Assigning a reliability score that represents a decrease in reliability with an increase in the order of the first sample.

4) Assigning a first reliability score when all the samples have a same value. Assigning a second reliability score when one of the multiple samples differs from another sample. The second reliability score is indicative of a lower reliability than the first reliability score.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for sampling a flash memory cell that belongs to a die, the method comprising:
    attempting, during a gate voltage change period, to change a value of a gate voltage of the flash memory cell from a first value to a second value;
    sampling, by a sampling circuit that belongs to the die, an output signal of the flash memory cell multiple times during the voltage gate change period to provide multiple samples;
    defining a given sample of the multiple samples as a data sample that represents data stored in the flash memory cell;
    determining, by a processor that belongs to the die, a reliability of the data sample based on one or more samples of the multiple samples that differ from the given sample; and
    determining an allocation of the flash memory cell based upon the reliability of the data sample.

2. The method according to claim 1 wherein the determining of the reliability comprises searching for a difference between the multiple samples.

3. The method according to claim 1 wherein the determining of the reliability comprises assigning a reliability score that is responsive to an order, within the multiple samples, of a first sample that differs from a preceding sample.

4. The method according to claim 3 comprising assigning a reliability score that represent a decrease in reliability with an increase in the order of the first sample.

5. The method according to claim 1 wherein the determining of the reliability comprises assigning a first reliability score when all the samples have a same value; and assigning a second reliability score when one of the multiple samples differs from another sample; wherein the second reliability score is indicative of a lower reliability than the first reliability score.

6. The method according to claim 1 further comprising outputting, to a flash memory controller located outside the die, information about the reliability of the data sample.

7. The method according to claim 1, comprising decoding, by the processor, the data sample; wherein the decoding comprises utilizing information, generated by the processor, related to the reliability of the data sample.

8. The method according to claim 1, comprising receiving, by the processor error correction information that was generated outside the die and relates to the data sample; and decoding, by the processor, the data sample; wherein the decoding comprises (a) utilizing information, generated by the processor, related to the reliability of the data sample and (b) utilizing the error correction information.

9. The method according to claim 1, comprising controlling an execution of operations applied on the data sample in response to the reliability of the data sample.

10. The method according to claim 1, comprising preventing a copyback operation when the reliability of the data sample is below a reliability threshold.

11. The method according to claim 1, comprising selecting between an execution of a copyback operation and a provision of the data sample to an external flash memory controller based upon the reliability of the data sample.

12. A non-transitory computer readable medium that stores instructions that once executed by a computer cause the computer to sample a flash memory cell that belongs to a die, by:
   attempting, during a gate voltage change period, to change a value of a gate voltage of the flash memory cell from a first value to a second value;
   sampling, by a sampling circuit that belongs to the die, an output signal of the flash memory cell multiple times during the voltage gate change period to provide multiple samples;
   defining a given sample of the multiple samples as a data sample that represents data stored in the flash memory cell;
   determining, by a processor that belongs to the die, a reliability of the data sample based on one or more samples of the multiple samples that differ from the given sample; and
   preventing a copyback operation when the reliability of the data sample is below a reliability threshold.

13. The non-transitory computer readable medium of claim 12, wherein an allocation of the flash memory cell is determined based upon the reliability of the data sample.

14. The non-transitory computer readable medium of claim 12, wherein the determining of the reliability comprises searching for a difference between the multiple samples.

15. A semiconductor die that comprises a processor, a sampling circuit and a flash memory array; wherein the sampling circuit is configured to:

(a) attempt, during a gate voltage change period, to change a value of a gate voltage of the flash memory cell from a first value to a second value;
(b) sample an output signal of the flash memory cell multiple times during the voltage gate change period to provide multiple samples; wherein the processor is configured to define a given sample of the multiple samples as a data sample that represents data stored in the flash memory cell;
(c) determine a reliability of the data sample based on one or more samples of the multiple samples that differ from the given sample; and
(d) select between an execution of a copyback operation and a provision of the data sample to an external flash memory controller based upon the reliability of the data sample.

16. The semiconductor die of claim 15, wherein the sampling circuit is further configured to prevent a copyback operation when the reliability of the data sample is below a reliability threshold.

17. The semiconductor die of claim 15, wherein the sampling circuit is further configured to determine an allocation of the flash memory cell based upon the reliability of the data sample.

18. A method for sampling a flash memory cell that belongs to a die, the method comprising:
   performing a first attempt, during a first gate voltage change period, to change a value of a gate voltage of the flash memory cell from a first value to a second value;
   sampling, by a sampling circuit that belongs to the die, an output signal of the flash memory cell multiple times during the first voltage gate change period to provide multiple first samples; and
   defining a first given sample of the first multiple samples as a first data sample that represents data stored in the flash memory cell;
   determining, by a processor that belongs to the die, a reliability of the first data sample based on one or more samples of the first multiple samples that differ from the first given sample;
   performing a second attempt, during a second gate voltage change period, to change a value of a gate voltage of the flash memory cell from a first intermediate value to a third value; wherein the second attempt starts before a completion of the first attempt and when the gate voltage of the flash memory cell reached the first intermediate value;
   defining a second given sample of the second multiple samples as a second data sample that represents the data stored in the flash memory cell;
   determining, by the processor, a reliability of the second data sample based on one or more samples of the second multiple samples that differ from the second given sample; and
   preventing a copyback operation when the reliability of the first data sample or the second data sample is below a reliability threshold.

19. The method of claim 18, further comprising determining an allocation of the flash memory cell based upon the reliability of the first data sample or the second data sample.

20. The method of claim 18, further comprising selecting between an execution of a copyback operation and a provision of the second data sample to an external flash memory controller based upon the reliability of the second data sample.

* * * * *

UNITED STATES PATENT AND TRADEMARK OFFICE
CERTIFICATE OF CORRECTION

| | |
|---|---|
| PATENT NO. | : 9,851,921 B1 |
| APPLICATION NO. | : 14/919558 |
| DATED | : December 26, 2017 |
| INVENTOR(S) | : Hanan Weingarten and Erez Sabbag |

It is certified that error appears in the above-identified patent and that said Letters Patent is hereby corrected as shown below:

On the Title Page

Column 1: REPLACE "Applicant: AVAGO TECHNOLOGIES GENERAL IP (SINGAPORE) PTE. LTD., Yishun (SG)" with "Applicant: AVAGO TECHNOLOGIES GENERAL IP (SINGAPORE) PTE. LTD., Singapore (SG)"

Signed and Sealed this
Nineteenth Day of June, 2018

Andrei Iancu
*Director of the United States Patent and Trademark Office*